(12) United States Patent
Voigt

(10) Patent No.: US 9,703,701 B2
(45) Date of Patent: Jul. 11, 2017

(54) ADDRESS RANGE TRANSFER FROM FIRST NODE TO SECOND NODE

(71) Applicant: Hewlett Packard Enterprise Development LP, Houston, TX (US)

(72) Inventor: Douglas L Voigt, Boise, ID (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/765,057

(22) PCT Filed: Mar. 28, 2013

(86) PCT No.: PCT/US2013/034382
§ 371 (c)(1),
(2) Date: Jul. 31, 2015

(87) PCT Pub. No.: WO2014/158166
PCT Pub. Date: Oct. 2, 2014

(65) Prior Publication Data
US 2015/0370702 A1    Dec. 24, 2015

(51) Int. Cl.
*G06F 11/07*    (2006.01)
*G06F 12/08*    (2016.01)
(Continued)

(52) U.S. Cl.
CPC ...... *G06F 12/0292* (2013.01); *G06F 11/1443* (2013.01); *G06F 11/2094* (2013.01);
(Continued)

(58) Field of Classification Search
CPC .... G06F 9/466–9/467; G06F 2209/521; G06F 11/073; G06F 11/2043;
(Continued)

(56) References Cited

U.S. PATENT DOCUMENTS 6,360,231 B1 * 3/2002 Pong .................. G06F 12/0815
6,643,671 B2    11/2003 Mililloet al.
(Continued)

FOREIGN PATENT DOCUMENTS

EP    1510924 A1    3/2005
EP    2428896       3/2012
(Continued)

OTHER PUBLICATIONS

Blundell, C. et al., Subtleties of Transactional Memory Atomicity Semantics, (Research Paper), Feb. 2006, vol. 5, No. 2, 4 pps., http://acg.cis.upenn.edu/papers/cal06_atomic_semantics.pdf.
(Continued)

*Primary Examiner* — Edward Dudek, Jr.
*Assistant Examiner* — Andrew Russell
(74) *Attorney, Agent, or Firm* — Hewlett Packard Enterprise Patent Development

(57) ABSTRACT

A group address range is mapped to a memory address range of a nonvolatile memory. A first memory address of the memory address range is to be copied to a volatile memory if the first memory address is mapped to the group address range and a write access is requested for the first memory address. The group address range is transferred from a first node to a second node in response to a synch command. The copied address is to be written the NVM after the group address range is transferred.

20 Claims, 7 Drawing Sheets

(51) Int. Cl.
*G06F 13/42* (2006.01)
*G06F 12/02* (2006.01)
*G06F 13/40* (2006.01)
*G06F 12/0804* (2016.01)
*G06F 12/0868* (2016.01)
*G06F 11/14* (2006.01)
*G06F 11/20* (2006.01)
*G11C 16/22* (2006.01)
*G06F 17/30* (2006.01)

(52) U.S. Cl.
CPC ...... *G06F 11/2097* (2013.01); *G06F 12/0238* (2013.01); *G06F 12/0804* (2013.01); *G06F 12/0868* (2013.01); *G06F 13/404* (2013.01); *G06F 17/30268* (2013.01); *G06F 17/30581* (2013.01); *G06F 2212/1008* (2013.01); *G06F 2212/1032* (2013.01); *G06F 2212/1048* (2013.01); *G06F 2212/214* (2013.01); *G06F 2212/7201* (2013.01); *G11C 16/22* (2013.01)

(58) Field of Classification Search
CPC ......... G06F 11/2097; G06F 12/0802–12/0897; G06F 2212/1008; G06F 17/30575–17/30581
See application file for complete search history.

(56) References Cited

U.S. PATENT DOCUMENTS

| | | | |
|---|---|---|---|
| 6,658,540 B1 | 12/2003 | Sicola et al. | |
| 6,789,156 B1 | 9/2004 | Waldspurger | |
| 7,133,982 B2 | 11/2006 | Werner et al. | |
| 7,464,126 B2 | 12/2008 | Chen | |
| 7,734,883 B2 | 6/2010 | Spear et al. | |
| 7,818,515 B1 | 10/2010 | Umbehocker et al. | |
| 8,195,615 B2 | 6/2012 | Schlomer et al. | |
| 8,244,969 B2 | 8/2012 | McWilliams et al. | |
| 9,053,027 B1* | 6/2015 | Harvey | G06F 9/467 |
| 2004/0260673 A1 | 12/2004 | Hitz et al. | |
| 2006/0031450 A1* | 2/2006 | Unrau | H04L 67/1095 |
| | | | 709/223 |
| 2007/0022264 A1* | 1/2007 | Bromling | G06F 11/2064 |
| | | | 711/162 |
| 2007/0143545 A1 | 6/2007 | Conley et al. | |
| 2007/0233947 A1 | 10/2007 | Coulson et al. | |
| 2007/0239944 A1 | 10/2007 | Rupanagunta et al. | |
| 2007/0288587 A1* | 12/2007 | Aguilera | G06F 9/466 |
| | | | 709/214 |
| 2008/0229428 A1 | 9/2008 | Camiel | |
| 2009/0300078 A1 | 12/2009 | Boyd et al. | |
| 2010/0125555 A1 | 5/2010 | Lau et al. | |
| 2010/0199042 A1 | 8/2010 | Bates et al. | |
| 2010/0268899 A1 | 10/2010 | Etoh et al. | |
| 2010/0325376 A1 | 12/2010 | Ash et al. | |
| 2011/0072189 A1 | 3/2011 | Post et al. | |
| 2011/0072196 A1 | 3/2011 | Foriian et al. | |
| 2011/0238899 A1 | 9/2011 | Yano et al. | |
| 2013/0332660 A1* | 12/2013 | Talagala | G06F 12/0246 |
| | | | 711/103 |
| 2014/0075122 A1* | 3/2014 | Banikazemi | G06F 11/00 |
| | | | 711/133 |

FOREIGN PATENT DOCUMENTS

| | | |
|---|---|---|
| JP | 2005310008 | 11/2005 |
| TW | 201227293 A1 | 7/2012 |
| TW | I370359 | 8/2012 |
| TW | 1383322 | 1/2013 |

OTHER PUBLICATIONS

Distributed Shared Memory, (Research Paper), Mar. 17, 2005, pp. 749-781, http://www.cdk5.net/dsm/Ed4/Chapter%2018%20DSM.pdf.
International Search Report and Written Opinion received in PCT Application No. PCT/US2013/034382, mailed Dec. 26, 2013, 9 pgs.
International Search Report and Written Opinion received in PCT Application No. PCT/US2013/034398, rnailed on Dec. 26, 2013, 12 pgs.
Extended European Search Report received in EP Application No. 13880042.0, Sep. 21, 2016, 10 pages.
Gill, B.S. et al., "WOW: Wise Ordering for Writes—Combining Spatial and Temporal Locality in Non-Volatile Caches," Proceedings of the 4th Conference on USENIX Conference on File and Storage Technolodies—vol. 4, USENIX Association, 2005, pp. 129-142.

* cited by examiner

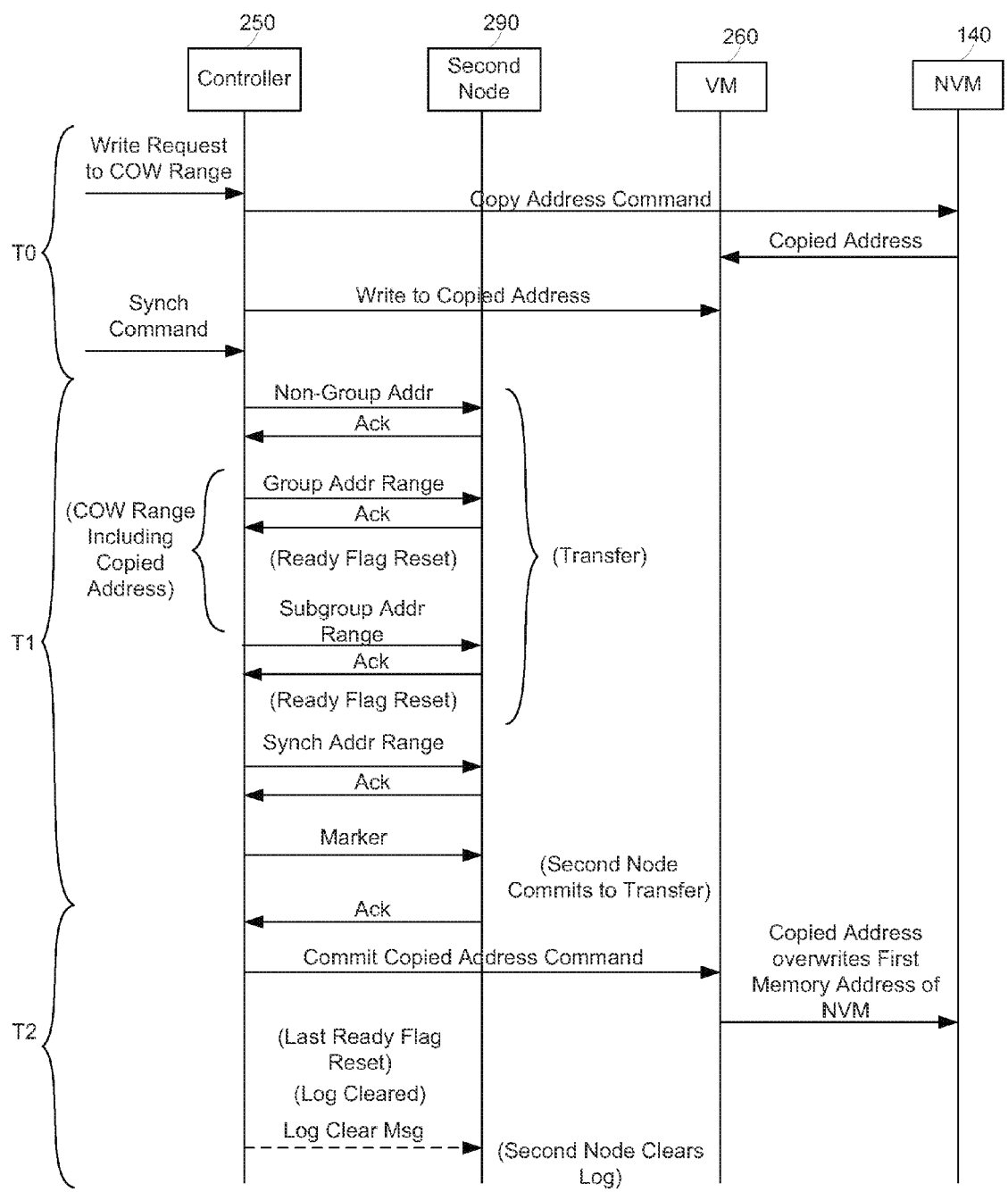

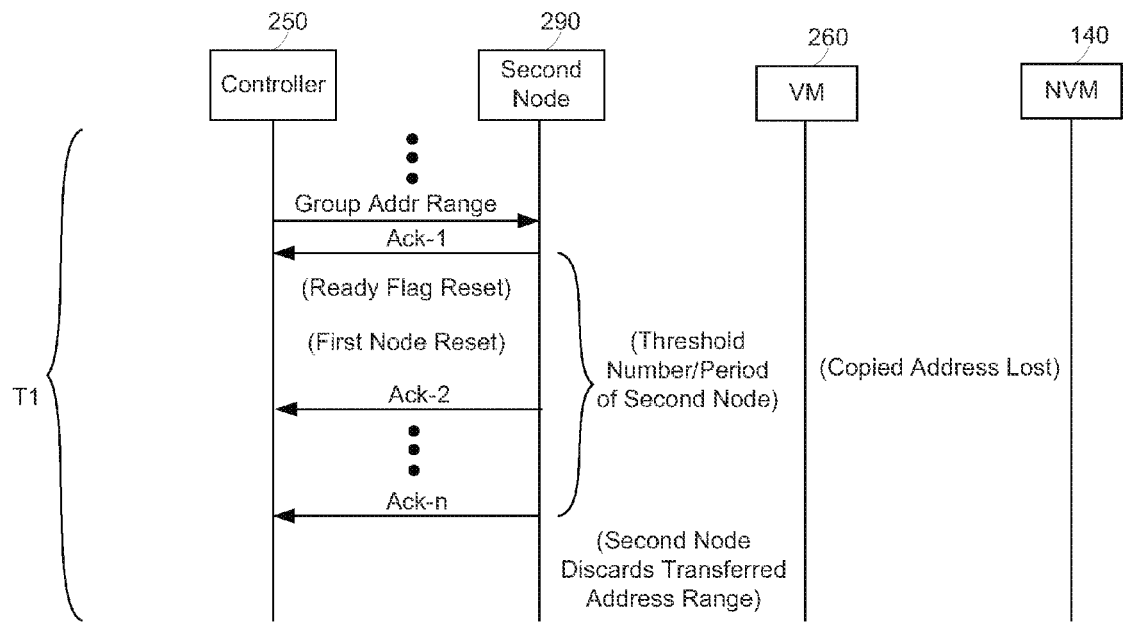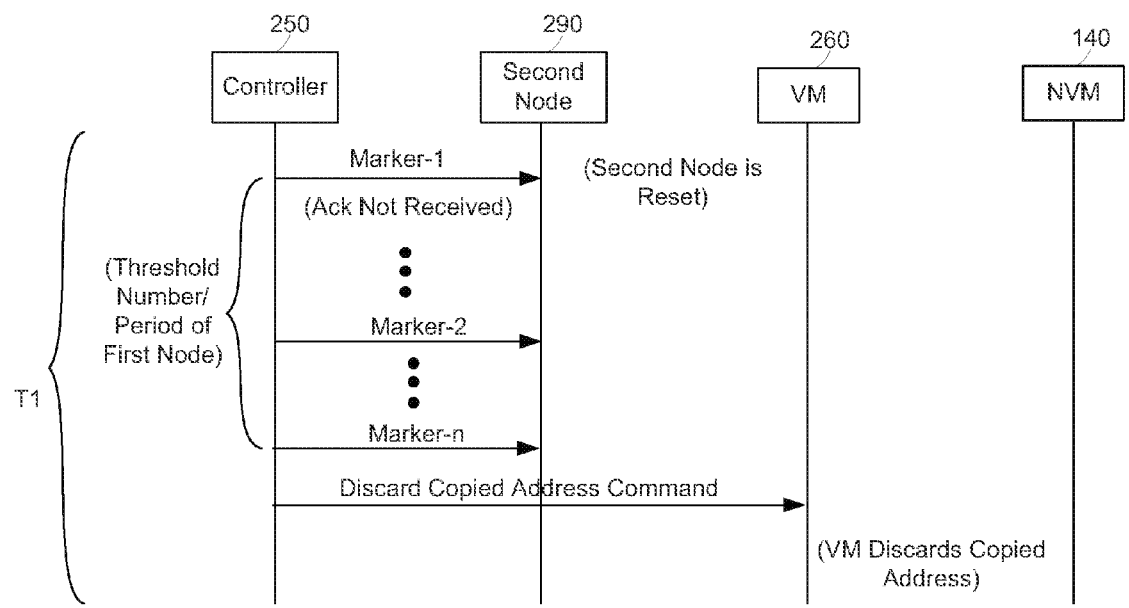

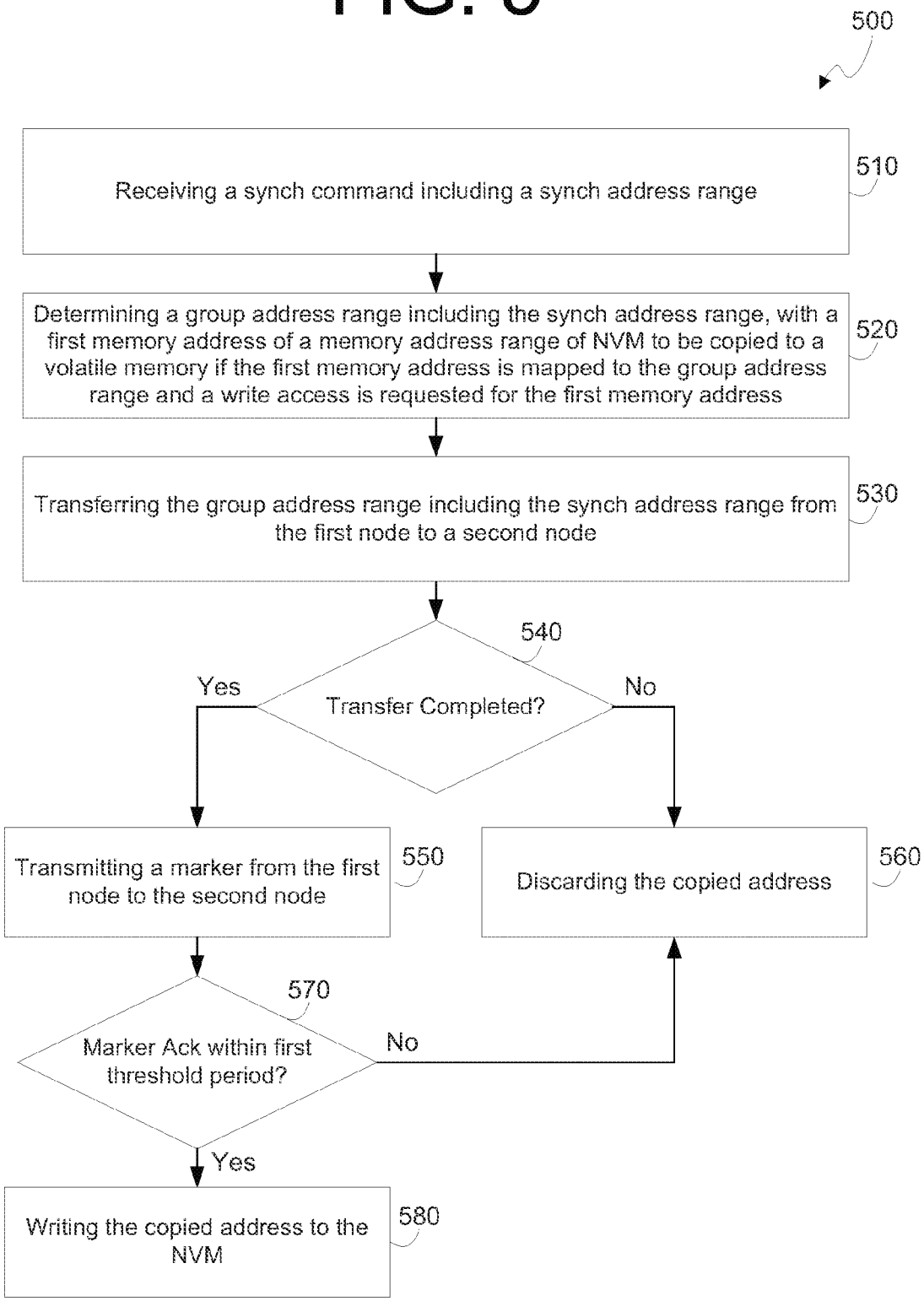

ADDRESS RANGE TRANSFER FROM FIRST NODE TO SECOND NODE

BACKGROUND

Due to recent innovations in solid state storage technology, such technology is being integrated into data systems. Servers of the data systems may seek to write data to or read data from the solid state storage technology. Users, such as administrators and/or vendors, may be challenged to integrate such technology into systems while maintaining atomicity.

BRIEF DESCRIPTION OF THE DRAWINGS

The following detailed description references the drawings, wherein:

FIGS. 3A-3D are example block diagrams of various states of the first node of FIG. 2;

FIG. 5 is an example flowchart of a method for transferring an address range from a first node to a second node.

DETAILED DESCRIPTION

Figure 1:
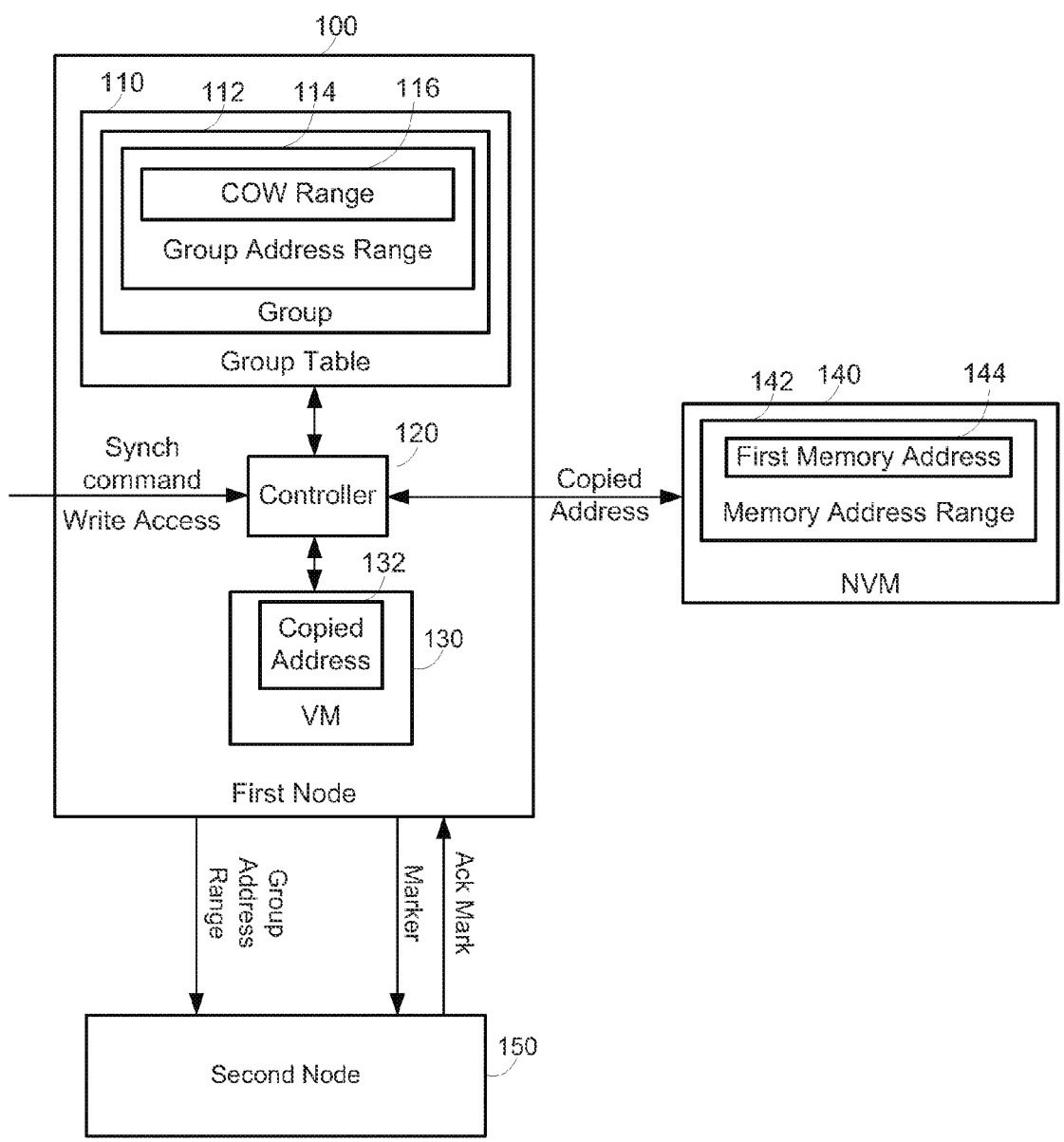
FIG. 1 is an example block diagram of a first node to transfer to an address range to a second node.

Specific details are given in the following description to provide a thorough understanding of embodiments. However, it will be understood that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Non-Volatile memory (NVM) technologies such as Memristor may offer both durability and memory speed access. This type of NVM may be mapped into server memory space for direct load/store access. When applying a full range of rich data services for redundancy, replication, backup and archive to memory mapped storage, it may be necessary to establish groupings of data which must remain self consistent within and across multiple memory systems.

Memory consistency is generally managed locally by processors and memory controllers. While existing approaches may enforce strict ordering and cache coherency, these approaches may not scale for clustered, federated, remote replication and/or client/server relationships such as those that might exist between application servers and storage servers. The root cause of this is that strict consistency as seen in a single processor or symmetric multiprocessor (SMP) system may be cost prohibitive to maintain beyond a limited physical scope.

When NVM is written directly to by processors using store instructions, some applications may need to avoid over-writing persistent data with new data before a complete multi-part update or transaction has been accumulated. This is done by making a temporary copy of work in progress and committing it to the NVM at a later time (e.g. copy-on-write). Usually, this occurs one page or memory range at a time, which does not allow an entire update to be atomic if there is a power loss or failure.

Embodiments may couple copy-on-write (COW) operations with synchronize operations and groups to achieve atomicity over a larger scope. These groups may be defined by applications to address their specific consistency requirements. Once coupled, writes maybe redirected to a copy of the original NVM location. Normal synchronize operations may flush data to the copy but may not modify master pages nor designate pages for transmission. For example, a first node may include a group table and a controller. The group table may include a group associated with a group address range that is mapped to a memory address range of a NVM. The group address range may include a COW range.

A first memory address of the memory address range may be copied to a volatile memory if the first memory address is mapped to the COW range and a write access is requested for the first memory address. The controller may transfer the group address range from the first node to a second node according to an order determined by the group table, in response to a synch command. The controller may transmit a marker after the transfer is complete. The controller may write the copied address to the NVM after the second node acknowledges the marker.

Thus, embodiments may link isolated address group-wise ranges (or page-wise) COW operations together within group operations through a single synchronization operation. Accordingly, the COW operations may be coordinated with the transmission of memory address ranges to another node. This may enable COW operation to be made atomic with respect to power loss or server failure.

Atomicity is achieved by using the transferred address ranges within the group to roll the master image of the NVM forward during recovery, in the event that not all COW pages were committed to the master image due the power loss or failure. Hence, multiple COW operations may become atomic. The scope of COW atomicity is extended across disjoint memory location ranges, memory systems and servers. This may enable consistent data images or virtualized images to be established that adhere to application specific rules. These images may then be cast as various types of data replicas or used to perform data analysis such as deduplication or classification that require consistent and recoverable states of the data.

Referring now to the drawings, FIG. 1 is an example block diagram of a first node 100 to transfer to an address range to a second node 150. The first and/or second nodes 100 and 150 may be part of or included in, for example, a storage device, computer, switch, enclosure, server, controller and/or any type of device connected to a network. In the embodiment of FIG. 1, the first node 100 is shown to include a group table 110, a controller 120 and a volatile memory (VM) 130. Further, the first node 100 is shown to interface with a NVM 140 and the second node 150. Although, the below description primarily refers to the first node 100, the second node 150 may include similar functionality and/or components.

The first node 100 may include, for example, a hardware device including electronic circuitry for implementing the functionality described below, such as control logic and/or memory. In addition or as an alternative, the first node 100 may be implemented as a series of instructions encoded on a machine-readable storage medium and executable by a processor. The volatile memory 130, may be any type of device that requires power to maintain the stored information, such as processor cache (not shown).

The NVM 140 may include any type of device that retains its data when power is turned off, such as read-only memory, flash memory, ferroelectric RAM (F-RAM), most types of magnetic computer storage devices (e.g. hard disks, floppy disks, and magnetic tape) and optical discs as well as Memristor-based, Spin-Torque transfer, and Phase Change random-access memory. For example, the NVM may include a memory that is read or written on a per-byte or per-processor-cache line basis.

The group table 110 includes a group 112 and the group 112 includes a group address range 114. The group address range 114 may be mapped to a memory address range 142 of the NVM 140. For example, the group address range 114 may include one or more addresses that are mapped to one or more addresses of the memory address range 142. The term mapping may refer to a technique for incorporating one or more memory addresses of a device, such as the NVM 140, into an address table of another device, such as group table 110 of the first node 100. While the group table 110 is shown to include a single group 112 and the group 114 is shown to include a single group address range 114, embodiments of the group table 110 may include a plurality of groups 112 and embodiments of the group 112 may include a plurality of address ranges 114.

The group address range may further include a copy-on-write (COW) range 116. A first memory address 144 of the memory address range 142 may be copied 132 to the VM 130 if the first memory address 144 is mapped to the COW range 116 and a write access is requested for the first memory address 144. The copied address may 132 may include any data stored at the first memory address 144 and be associated with the first memory address 144, such as via a virtual memory table (not shown).

The controller 120 may receive a synch command including a synch address range. For example, an application (not shown), may occasionally generate the synch command in order to define a recovery point. The synch command may be generated, for example, via an explicit call or it may be implicit in some use of the language in which the application is written. The synchronization operation may traverse either a software path or a hardware path to the NVM 140. The application may create one or more of the groups 112 to represent its large scale data structures such as data tables, indices and logs. The application may then populate the groups 112 with group address ranges 114 that reflect the application's overall data structures.

The synch operation may include flush instructions, which are executed by a processor (not shown) and/or synchronization commands that are communicated to the NVM 140. For example, during the sync operation, virtual memory tables (not shown), group tables 110 and/or sub-group tables (not shown) may be used to coordinate the flushing of additional addresses (or pages) over and above those initially referenced by the synch address range 116 of the synch command. These additional addresses may be determined by the group table 110 based on whether the synch address range is included in a group address range 114 of any of the groups 112 of the group table 110.

The sync operation may also transfer the flushed addresses to another node, such as the second node 150, according to an order that retains application level consistency, as determined by the group table 110. For example, the controller 120 may transfer the group address range 114 from the first node to the second node 150 according to an order determined by the group table 110, in response to a synch command. Further, the controller 120 of the first node 100 may transmit a marker after the transfer is complete. The controller may write the copied address 132 to the NVM 140 after the second node acknowledges the marker. The group table 110 will be described in greater detail below with respect to FIG. 2.

Figure 2:
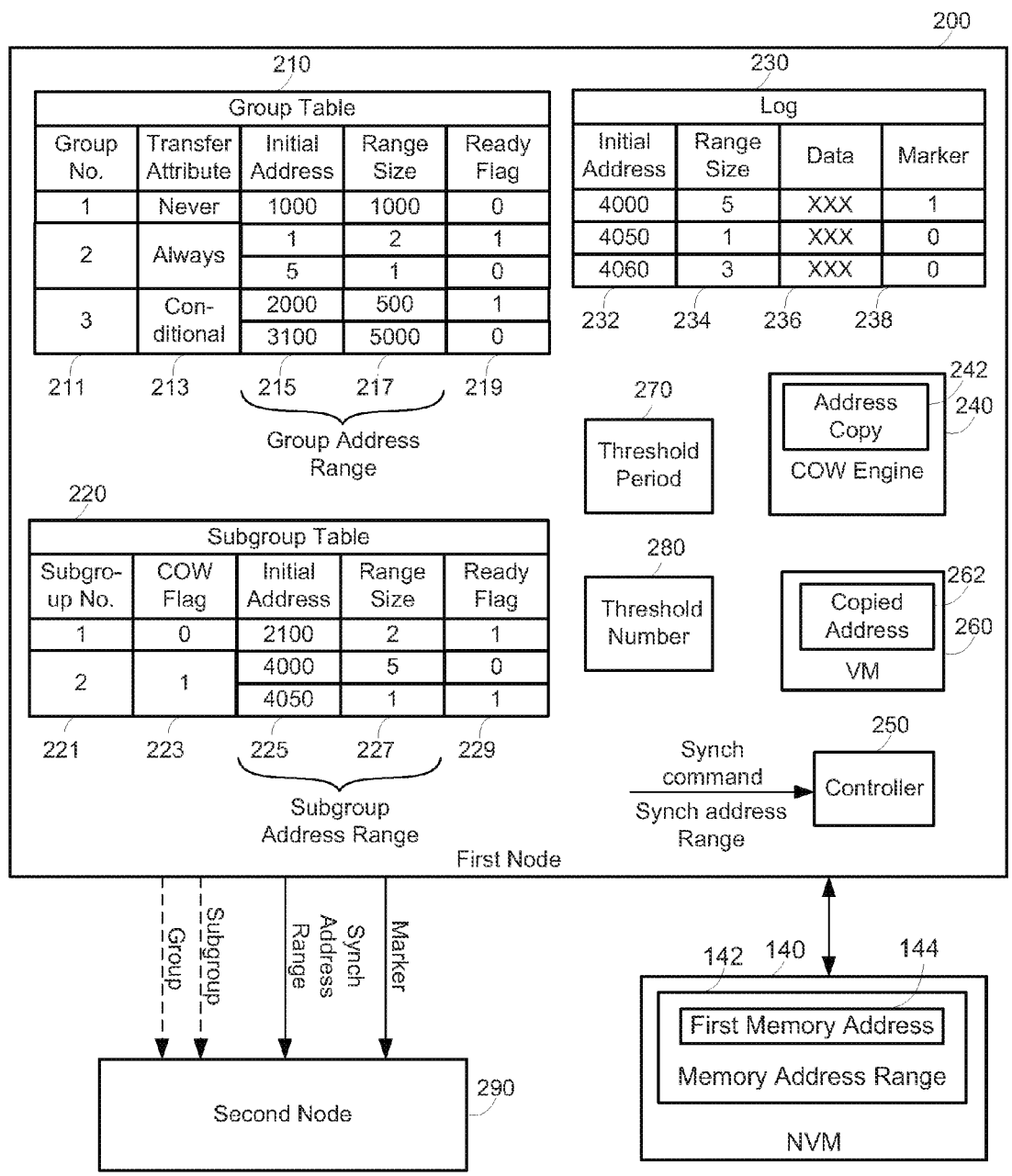
FIG. 2 is another example block diagram of a first node to transfer an address range to a second node.

FIG. 2 is another example block diagram of a first node 100 to transfer an address range to a second node 290. In FIG. 2, the first node 200 includes a group table 210, a subgroup table 220, a log 230, a copy-on write (COW) engine 240, a controller 250, a VM 260, a threshold period 270 and a threshold number 280. The first node 200 is shown to interface with the second node 290 and the NVM 140, such as via a network connection.

The first and second nodes 200 and 290 of FIG. 2 may include similar functionality and/or hardware to the first and second node 100 and 150 of FIG. 1. For example, the group table 210, the controller 250 and the VM 260 of FIG. 2 may respectively include the functionality and/or hardware to the group table 110, the controller 120 and the VM 130 of FIG. 1.

The controller 250 may selectively transmit addresses written to the memory address range 142 of the NVM 140 as well as the VM 260 to other devices, such as the second node 290, for the purpose of duplicating the data and thus, maintaining recoverability in the event of various types of failure.

The group table 210 is shown to include a group number column 211, a transfer attribute column 213, an initial address column 215, a range size column 217 and a ready flag column 219. Here, the group number column 211 indicates that the group table 210 has three groups 1-3. Each of the groups 211 is associated with a transfer attribute of the transfer attribute column 213 that determines whether the associated group is to be transferred in response to the synch command.

For example, the transfer attribute 213 may have a value of never, always or conditional. The never value may indicate that the corresponding group is not to be transferred in response to the synch command. The always value may indicate that the corresponding group is to always be transferred in response to the synch command. The conditional value may indicate that the corresponding group is only to be transferred if a type of the synch command is master. Thus, in FIG. 2, in response to the synch command, the first group 1 may never be transferred, the second group 2 may always be transferred and the third group 3 may be transferred only if the synch command is a master type (as opposed to a normal type). As explained below, when configured to operate in a COW mode, writes are redirected to the copied address 262 at the VM 260 and normal synchronize operations may flush data to the copied address 262 at the VM 260 but not modify the first memory address 144 at the NVM 140 nor designate the copy for transfer to the NVM 140 or the second node 290. However, master type synchronize operations may cause all copied locations to be flushed to the NVM 140 itself as well as transferred to the second node 290. Thus, master type synchronize operations may enable integration with COW implementations through a compatible interface and enable further optimization of replica transmission.

The group address range 114 described in FIG. 1 may include an initial address from the initial address column 215 and a corresponding range size from the range size column 217 of the group table 210. The range size may indicate a number of consecutive addresses following the initial address that is included in the group address range. In one embodiment, these addresses may be physical addresses in that they do not change across access context or time. For example, these addresses may reference the same data storage locations in the NVM 140 regardless of which processor thread, process or node is doing the access. Although the group address range consists of an initial address and a range size, embodiments of the group address range may be of any size and/or address resolution. For example, the address resolution may be bytes, cache lines, cache pages or other blocking factors.

The ready flag column 219 of the group table 210 may provide a ready flag for each of the group address ranges. The ready flag may relate to scheduling a transfer of the associated group address range to another node, such as the second node 290. For example, if the transfer ready flag is reset or 0, this may indicate that there is currently no need to transfer the associated group address range. On the other hand, if the transfer ready flag is set or 1, this may indicate that transfer of the associated group address range is being orchestrated (e.g. requested, queued or in progress).

Here, the three groups 1-3 of the group table 210 each have a different transfer attribute setting. The group address ranges contained in the various groups 1-3 are non-overlapping. Therefore, each memory location 282 of the NVM 140 is in at most one group. The group address ranges starting with the initial 1 and 2000 have the ready flag set. Thus, they are currently being transferred to another server for purposes of redundancy, replication and/or participation in other rich data services.

The subgroup table 220 is shown to include a subgroup number column 221, COW column 223, an initial address column 225, a range size column 227 and a ready flag column 229. The subgroup number column 221, initial address column 225, range size column 227 and ready flag column 229 of the subgroup 220 may respectively be similar in function to the group number column 211, initial address column 215, range size column 217 and ready flag column 219 of the group table 210. For example, the subgroup number column 221 may list one or more subgroups. Each of the subgroups may be associated with a subgroup address range 225 and 227 and a ready flag from the ready flag column 229.

The subgroup address range 225 and 227 may consist of an initial address from the initial address column 225 and a range size from the range size column 227. Each of subgroup address ranges 225 and 227 is included in one of the group address ranges 215 and 217 of the group table 210. Thus, every address in a sub-group is also in one of the groups. In this embodiment, any subgroup is also entirely contained within a single one of the groups. Each of the subgroups is also associated with a COW flag of the COW flag column 223. The COW flag may indicate that the corresponding subgroup uses a COW operation.

The COW flag may be set if writes to the corresponding subgroup address range are to be carried out on a copy of the data corresponding to subgroup address range. For example, if the COW flag is set, a copy of one or more address at the NVM 140, such as the first memory address 144, the memory address range 142 or a page of addresses) may be stored at the at VM 260 for a write request to that original address of the NVM 140. Subsequent reads and writes may then be redirected to the copied address. The original address may be used to recover to a consistent state after a power loss. The controller 250 may wait to write the copied address back to the NVM 140 until the copied address is transferred to another device, such as the second node 290, in response to the synch command.

The COW 240 engine may be, for example, a hardware device including electronic circuitry for implementing the functionality described below, such as control logic and/or memory. In addition or as an alternative, the COW 240 engine may be implemented as a series of instructions encoded on a machine-readable storage medium and executable by a processor. The COW 240 engine may generate the address copies 242 associated with the subgroup address range 225 and 227 in response to write operations to the subgroup address range 225 and 227. The address copies may be written to the NVM 140 if the COW flag is set and the type of the synch command is master.

The subgroup address ranges 225 and 227 included in a group are associated with the transfer attribute of that group. Here, the subgroups 1 and 2 are subsets of the third group 3, which has a conditional transfer attribute. Since the COW flag is set for the subgroup 2, if the master type synch command is received having a synch address range included in the subgroup 2, then the copied address of the subgroup 2 is to be written to the NVM 140 after the copied address is transferred to second node 290.

There is a precedence relationship between groups and subgroups such that synchronizes operations that address locations in a subgroup do not apply to locations in other subgroups. The synchronizes operations, however, do apply to locations in the same group, which are not in any other subgroup. This enables a useful capability to manage fine grained consistency for some data structures and coarse grained consistency for others. For example, bulk data may be in a group but not in a subgroup while related metadata may be in subgroup within that same group. In this example, if the synch range includes any location within the subgroup containing metadata, this may automatically cause synchronization of the entire subgroup as well as the bulk data at large in the associated group.

Non subgroup data may be synchronized first, followed by subgroup data, followed by the data specified by the synch address range. If the COW flag of the subgroup is set, the copied address may be written back to the NVM 140 as part of the synchronization of the subgroup. The ready flag of a group address range may not apply to any locations that are currently within subgroups, as it is overridden by the subgroup's ready flag. A value of the ready flag for the subgroup address range 225 and 227 may supersede a value of the ready flag for the group address range 215 and 217 including the subgroup address range 225 and 227.

The synchronization operation may include the flush and/or transfer operation. The transfer operation may follow the flush operation and follow the order described above with respect to synchronization. The transfer operation may be carried out by the controller 250, with the flushed data being transferred to another device, such as the second node 290, in response to the synch command. For example, the controller 250 may flush and transfer the group address range 215 and 217 including the subgroup address range 225 and 227 before the subgroup address range 225 and 227 and may flush and transfer the subgroup address range 225 and 227 before the synch address range, if the synch address range is included in the subgroup address range.

The group or subgroup address range to be transferred may be first recorded by setting the ready flag in either the subgroup or group depending on the precedence description above. Then, the data in the address range may be sent to the second node 290 participating in the group. The ready flags of the group and subgroup address ranges may be reset after the corresponding group and/or subgroup address range is transferred to the second node 290 during a given synchronize operation, unless the group and/or subgroup address range is the last range being transferred.

In this case, the controller 250 may wait to reset the ready flag of the last range, until after the entire transfer is complete. For example, as noted above, the controller 250 may generally transfer the synch address range last to the second node 290. Then, the controller 250 may transmit a marker or packet to the second node 290 to indicate that a consistency point has been reached. Recoverable consistency points may span multiple memory ranges (such as pages or cache lines, multiple synch ops and multiple servers).

The resetting of the last transfer ready flag is thus delayed until the transfer of the marker is complete and all COW data have been committed to the NVM 140. When there are no more address ranges associated with set ready flags, in the subgroup or group, the transfer is complete.

The log 230 may store a list of the data that is successfully transferred to the second node 290 and may also store the data that is to be transferred to the second node 290. Here, the log 230 is shown to include an initial address column 232, a range size column 234, a data column 235 and a marker column 238. The initial address and range size columns 232 and 234 of the log 230 may be similar in function to the initial address and range size columns 215 and 217 of the group table 210. For example, the initial address and range size columns 232 and 234 of the log 230 may list the group or subgroup address ranges for which the transfer to the second node 290 is being orchestrated. The data column 236 may serve as a queue or buffer for the data to be transferred to the second node 290.

A marker of the marker column 238 may be set by the controller 250 after the corresponding group and/or subgroup address ranges have been successfully transferred to the second node. Thus, in the event that the transfer is interrupted, such as during a power failure, the controller 250 may check the log 230 afterward to determine which of the address ranges were transferred successfully. Thus, the controller 250 may not resend the data for which the marker is set. Conversely, the controller 250 may discard any data that was to be sent after the marker was set, in order to revert to a prior consistency point. Further, due to the log 230 acting as a buffer for the data, the log 230 may transfer the data independently of the controller 250, thus freeing the controller 250 to carry out other operations. Hence, the log 230 may improve the efficiency of data transfer to the second node 290.

The threshold period 270 may define an amount of time the first node 200 may wait for an acknowledgement from the second node 290, such as acknowledgement of receipt of the marker or group address range. The threshold number 280 may define a number of times the first node 200 may retransmit the marker or group address range if no acknowledgement is received. The threshold period and number 270 and 280 may be monitored simultaneously by the controller 250. For example, the controller 250 may count an amount of time that has passed as well as a number of times an address or marker has been retransmitted while waiting for the acknowledgement. If the threshold period 270 and/or threshold number 280 is exceeded, the first node 200 may conclude that the second node 290 is incapable of committing to the transfer and therefore discard the copied address 262 in order to maintain atomicity with the second node 290.

As noted above, the second node 290 may contain components similar to the first node 200. For example, the second node 290 may also contain a threshold period (not shown), a threshold number (not shown), and a log (not shown). However, the threshold period and/or number may be different and/or measured for different types of transmissions. Further, the log of the second node 290 may also record the address ranges received from the first node 200 during the transfer.

Embodiments may reduce an amount of data to be transferred by allowing applications to explicitly express which memory locations are to be synchronized together as part of the same group. The existence of groups having group address ranges may enable application consistency requirements to be implemented by synchronize operations while maintaining backward compatibility of synchronize operation syntax. Having subgroups within groups may enable finer grained cache flushing which reduces performance disruption. In addition, address ranges within subgroups and outside of sub-groups may be correctly managed within a single group. Groups and subgroups may enable more efficient transmission of recent writes for redundancy, remote replication or point in time copy in that fine grained updates can be grouped into less frequent transmissions based on explicitly specified application requirements and behavior.

Figure 3D:
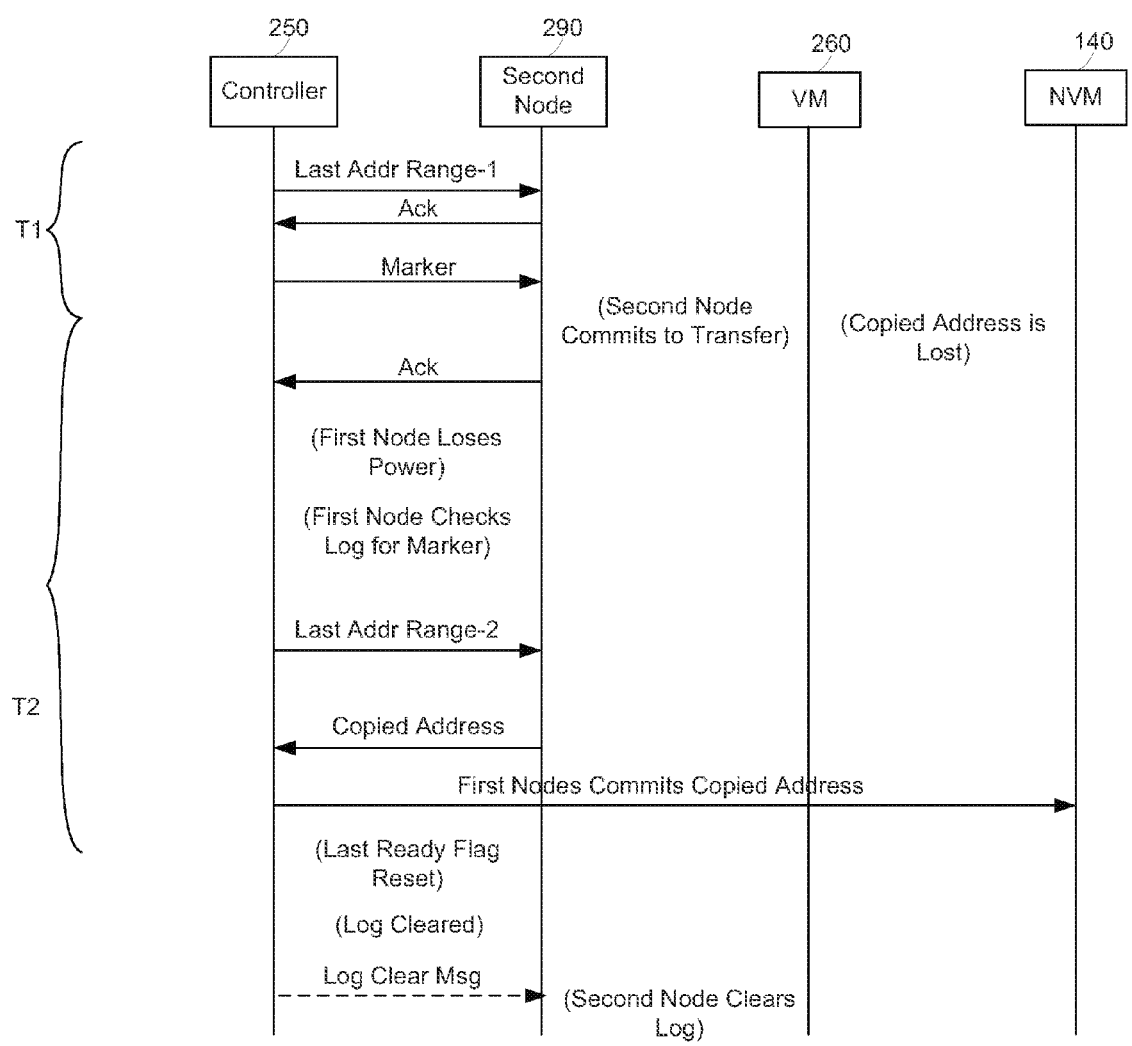

FIGS. 3A-3D are example timing diagrams of various states of operation between the first and nodes 200 and 290 of FIG. 2. FIG. 3A illustrates a normal state. During a time T0, the controller 250 of the first node 200 receives a write request to an address of the COW range. The controller 250 then sends a command to have an address 144 of the NVM 140, which correlates to the address of the COW range, to be copied to the VM 260. The subsequent write operation is then performed on the copied address 262 at the VM 260. Next, the controller 250 receives a synch command including a synch address range. Here, the synch address range is included in a subgroup and a group thereof has a transfer attribute value which allows the transfer to proceed. Thus, starting at a time T1, the controller 250 begins to transfer non-group addresses to the second node 290, and the second node 290 acknowledges receipt of this transfer.

Next, the controller 250 transfers group address ranges (excluding any subgroup address ranges), and the second node 290 acknowledges receipt. Upon receiving the acknowledgment, the controller 250 resets the corresponding ready flag(s). Then, the controller 250 transfers subgroup address ranges (excluding the synch address range), and the second node 290 again acknowledges receipt. Upon receiving the acknowledgment, the controller 250 resets the corresponding ready flag(s). Afterward, the controller 250 transfers the synch address range, and the second node 290 acknowledges receipt thereof.

However, the controller 250 does not reset the corresponding ready flag. Instead, the controller 250 transfers the marker. Upon receiving the marker, the second node 290 commits all of the transferred addresses to its own NVM, and then sends back an acknowledgment. At a time T2, after receiving the acknowledgment from the second node 290, the controller 250 sends a command to the VM 260 to have the copied address 262 written to the NVM 140. Only after the copied address 262 overwrites the first memory address 144, does the controller 250 reset the last ready flag and thus complete the transfer. In addition, the controller 250 may also clear the log 230 at this point. Optionally, the controller 250 may also send a message to the second node 290 to indicate that the first node 200 has cleared its log 230. The second node 290 may also then clear its log in response to this message.

In FIG. 3B, a state where the first node 200 loses power or is reset in a middle of a transfer is shown. Here, at the time T1, the first node 200 is reset after sending one of the group address ranges and receiving an acknowledgment. In this case, the controller 250 stops and leaves the transfer incomplete. Further, the copied address is lost before being transferred to the second node because it was only stored in the VM 260. When the second node 290 does not receive the next address range, the second node resends the previous acknowledgement. The second node 290 may resend the previous acknowledgment a plurality of times, up to a threshold number of the second node 290, during a threshold period of the second node 290. If the threshold number and/or period are reached the next address range is not received, the second node 290 may determine that the first node 200 is not reachable, and discard all of the transferred address ranges received from the first node 200, during this session.

FIG. 3C illustrates a state where the second node 290 loses power or is reset in a middle of a transfer. Here, at the time T1, the second node 290 is reset while receiving the marker from the first node 250, and thus does not acknowledge receipt of the marker. When the first node 290 does not receive the acknowledgement, the first node resends the marker. The first node 290 may resend the marker (or any address range) a plurality of times, up to a threshold number 280 of the first node 200, during a threshold period 270 of the first node 200. If the threshold number 280 and/or period 270 are reached and no acknowledgment is received, the first node 200 may determine that the second node 290 is not reachable, and send a command to the VM 260 to discard the copied address 262. The VM 260 may then discard the copied address 262 so that the first node 200 may retain memory consistency with the second node 290.

In FIG. 3D, a state is shown where the first node 200 loses power after transmitting the marker but before the first node can commit the copied address 262 to the NVM 140. Here, at the time T1, the controller 250 transfers the last address range and receives an acknowledgment of receipt from the second node 290. As noted above, the controller 250 does not reset the corresponding ready flag yet. Next, the controller 250 transmits the marker. Upon receiving the marker from the first node 200, the second node 290 commits the transfer to its NVM and sends an acknowledgment thereof. Subsequently, the first node 200 suffers a power loss and loses the copied address 262 before it can be retrieved from the VM 260. Upon being powered on again and noticing that only the ready flag of the last address range is still set, the first node 200 becomes aware that the transfer was not completed.

Then, the controller 250 of the first node 200 checks the log 230. As noted above, upon confirmation of receipt, the address ranges are recorded in the log 230 as being successfully transferred. After noting the marker was successfully transferred, the controller 250 determines that even though the first node 200 lost the copied address 262, the second node 290 may still have the copied address 262. Thus, the controller 250 sends the last group address range again to the second node 290. Upon receiving the last address range a second time after having already received the marker, the second node 200 determines that first node 200 has lost at least some of the transferred addresses, such as the copied address 262.

Next, the second node 290 sends at least the copied address 262 and up to all of the transferred address ranges back to the first node 200. The first node 20 then commits any and all of the lost addresses to the NVM 140. Next, the controller 250 acknowledges receipt of the one or more addresses that were transferred back. The controller 250 also then resets the last ready flag.

Similar to FIG. 3A, the first and second nodes 200 and 290 may also clear their logs afterward. Thus, the controller 250 may be able to receive the copied address 262 from the second node 290, if the transfer is interrupted by a power loss, the marker is recorded in the log 230, the copied address is recorded before the marker in the log 230 and the copied address 262 was not yet written to the NVM 140.

Figure 4:
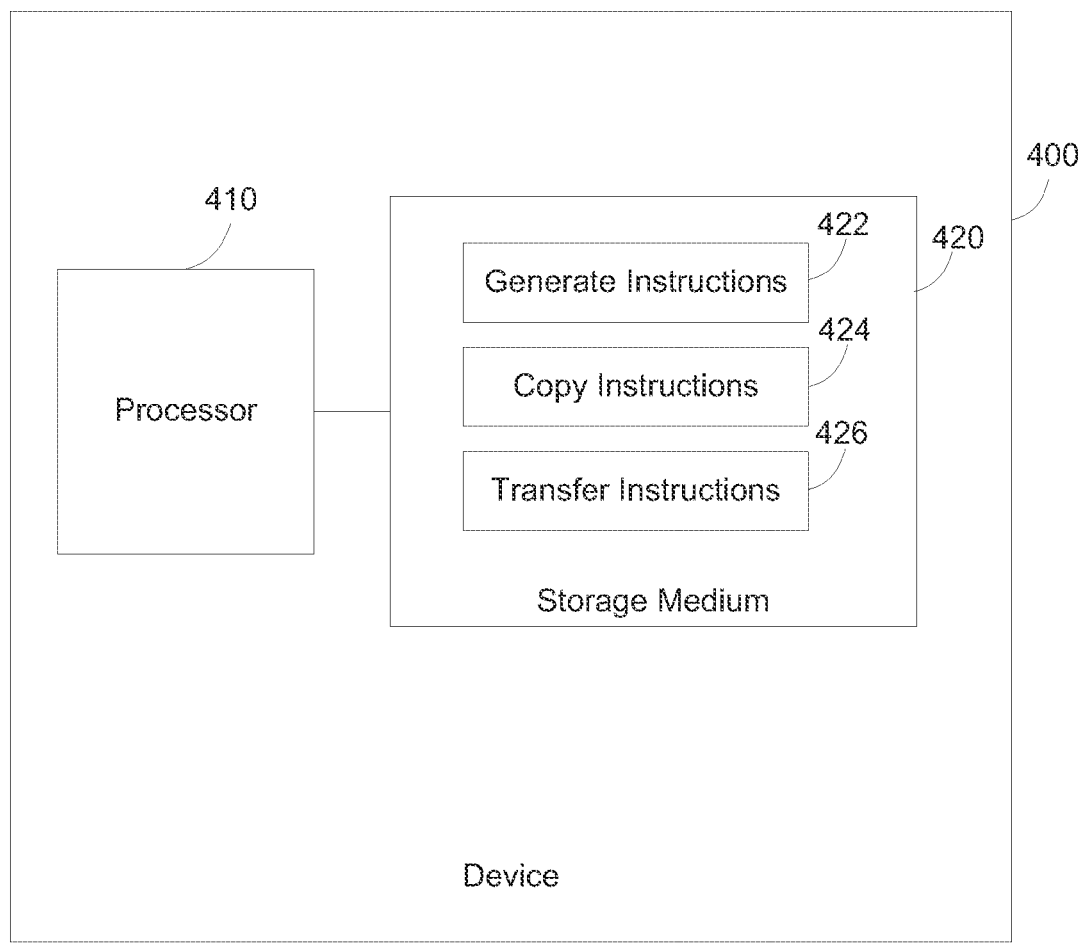
FIG. 4 is an example block diagram of a computing device including instructions for transferring an address range from a first node to a second node.

FIG. 4 is an example block diagram of a computing device 400 including instructions for transferring an address range from a first node to a second node. In the embodiment of FIG. 4, the computing device 400 includes a processor 410 and a machine-readable storage medium 420. The machine-readable storage medium 420 further includes instructions 422, 424 and 426 for transferring an address range from a first node (not shown) to a second node (not shown).

The computing device 400 may be, for example, a secure microprocessor, a notebook computer, a desktop computer, an all-in-one system, a server, a network device, a controller, a wireless device, or any other type of device capable of executing the instructions 422, 424 and 426. In certain examples, the computing device 400 may include or be connected to additional components such as memories, controllers, etc.

The processor 410 may be, at least one central processing unit (CPU), at least one semiconductor-based microprocessor, at least one graphics processing unit (GPU), other hardware devices suitable for retrieval and execution of instructions stored in the machine-readable storage medium 420, or combinations thereof. The processor 410 may fetch, decode, and execute instructions 422, 424 and 426 to implement transferring the address range from the first node to a second node. As an alternative or in addition to retrieving and executing instructions, the processor 410 may include at least one integrated circuit (IC), other control logic, other electronic circuits, or combinations thereof that include a number of electronic components for performing the functionality of instructions 422, 424 and 426.

The machine-readable storage medium 420 may be any electronic, magnetic, optical, or other physical storage device that contains or stores executable instructions. Thus, the machine-readable storage medium 420 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 420 can be non-transitory. As described in detail below, machine-readable storage medium 420 may be encoded with a series of executable instructions for transferring the address range from the first node to a second node.

Moreover, the instructions 422, 424 and 426 when executed by a processor (e.g., via one processing element or multiple processing elements of the processor) can cause the processor to perform processes, such as, the process of FIG. 4. For example, the generate instructions 422 may be executed by the processor 410 to generate, at the first node, a group address range mapped to a memory address range of a nonvolatile memory (NVM). The copy instructions 424 may be executed by the processor 410 to copy, at the first node, a first memory address of the memory address range to a volatile memory (not shown), in response to a write operation for the first memory address that is mapped to the group address range. The transfer instructions 426 may be executed by the processor 410 to transfer the group address range from the first node to the second node in response to a synch command including a synch address range. The group address range includes the copied address, where an address external to the synch address range and internal to the group address range is to be transferred before the synch range.

The copied address may be discarded by the first node if the second node does not acknowledge receipt of the group address range within a first threshold period. The copied address may be written to the NVM if the second node acknowledges receipt of the group address range with a second threshold period.

The first node may send a marker to the second node only after the transfer of the group address range is complete. The second node may acknowledge the marker in order to acknowledge receipt of the group address range. The second node may discard the transferred group address range if the second node does not receive the marker within the second threshold period.

FIG. 5 is an example flowchart of a method 500 for transferring an address range from a first node to a second node. Although execution of the method 500 is described below with reference to the first node 100, other suitable components for execution of the method 400 can be utilized, such as the first node 200 or 300. Additionally, the components for executing the method 500 may be spread among multiple devices (e.g., a processing device in communication with input and output devices). In certain scenarios, multiple devices acting in coordination can be considered a single device to perform the method 500. The method 500 may be implemented in the form of executable instructions stored on a machine-readable storage medium, such as storage medium 420, and/or in the form of electronic circuitry.

At block 510, the first node 100 receives a synch command including a synch address range. Then, at block 520, the first node 100 determines a group address range 114 including the synch address range. The group address range 114 may be mapped to a memory address range 142 of a NVM 140. A first memory address 144 of the memory address range 140 may be copied 132 to a VM 130 if the first memory address 144 is mapped to the group address range 114 and a write access is requested for the first memory address 144. The write access may then be granted to the copied address 132, instead of the first memory address 144.

Next, at block 530, the first node 100 transfers the group address range 114 including the synch address range to a second node 150, with the synch address range to be transferred last. At block 540, it is determined whether the transfer from the first node 100 to the second node 150 was completed. If the transfer is not completed, such as due to a power loss at the first node 100, the method 500 flows to block 560, where the first node 100 discards the copied address 132.

On the other hand, if the transfer is completed, the method 500 flows form block 540 to block 550, where the first node 100 transmits a marker to the second node 150. Then, at block 570, the method 500 determines whether the second node 150 acknowledged the marker to the first node 100 within a first threshold period of time. If the marker is not acknowledged, the method 500 flows back to block 560, where the copied address 132 is discarded by the first node 100.

Yet, if the marker is acknowledged, the method 500 flows from block 570 to block 580, where the first node 100 writes the copied address 132 to the NVM 140. The second node 150 may acknowledge the marker after the second node 150 successfully stores an entirety of the transferred group address range 114. The second node 150 may discard the transferred group address range 114 if the second node 150 does not receive the marker within a second threshold period of time.

According to the foregoing, embodiments may link memory COW operations with groups and/or sub-groups. This mechanism of synchronization may be used to implement atomicity within the process of committing multiple COW ranges to a master memory image, such as the NVM. As a result, in the event of a power loss or failure during a COW synchronize operation, synchronization will either complete in its entirety or not at all.

I claim:

1. A first node, comprising:
a group table including a first group that includes a first group address range that is mapped to a memory address range of a nonvolatile memory (NVM), the first group address range including a copy-on-write (COW) range, with a first memory address of the memory address range to be copied to a volatile memory if the first memory address is mapped to the COW range and a write access is requested for the first memory address; and
a controller to transfer address ranges included in the first group, including the first group address range, from the first node to a second node according to an order determined based on the group table, in response to a synchronize command, wherein
the controller is to transmit a marker after the transfer is complete, and
the controller is to write the copied address to the NVM after the second node acknowledges the marker.

2. The first node of claim 1, wherein,
the group address range is associated with a ready flag,
the controller is to set the ready flag of the group address range, if the group address range is to be transferred to the second node, and
the controller is to reset the ready flag of the group address range after the group address range is transferred to the second node.

3. The first node of claim 2, wherein,
the group table includes a plurality of the group address ranges, each of the group address ranges to be associated with one of a plurality of the ready flags, and
the controller is to reset the ready flag of the group address range that is transferred last after the second node acknowledges receipt of the marker and the copied address is written to the NVM.

4. The first node of claim 3, further comprising:
a log to record the group address ranges after the group address ranges are transferred to the second node, wherein the log is to record the marker after the marker is transferred to the second node.

5. The first node of claim 4, wherein,
the controller is to stop and leave the transfer incomplete, if the copied address is lost before being transferred to the second node, and
the second node is to discard the transferred group address range from the first node, if the second node does not receive the marker.

6. The first node of claim 5, wherein,
the controller is to receive the copied address from the second node, if the transfer is interrupted by a power loss, the marker is recorded in the log, the COW range is recorded before the marker in the log and the copied address is not written to the NVM.

7. The first node of claim 4, wherein,
the controller is to clear the log after the ready flag of the last group address range is reset, and
the copied address is lost if the first node loses power before the copied address is written to the NVM.

8. The first node of claim 3, wherein,
the controller is to resend the marker to the second node, if the second node does not acknowledge receipt of the marker, and
the second node is to the acknowledge the marker to the first node after the second node receives the marker from the first node and all of the group address ranges transferred to the second node are stored at a NVM accessible by the second node.

9. The first node of claim 3, wherein,
the controller is to send the last group address range, if the first node is reset and only the ready flag of the last group address range remains set after the first node is reset, and
the second node is to send all of the transferred the group address ranges back to the first node, if the second node receives the last group address range after the receiving the marker.

10. The first node of claim 1, wherein,
the first node is to discard the copied address if the marker is not acknowledged by the second node after at least one of a first threshold period and a first threshold number of retransmissions of the marker to the second node, and
the second node is to discard the group address range transferred from the first node, if the second node does not receive the marker after at least one of a second threshold period and a second threshold number of retransmissions of an acknowledgment of the group address range last received by the second node.

11. The first node of claim 1, wherein, the copied address is modified in response to a write access for the first memory address, and
the controller is to write the copied address back to the first memory address of the NVM after second node acknowledges the marker.

12. A method, comprising:
receiving, at a first node, a synchronize command including a synchronize address range;
identifying, in a group table that includes a number of group address ranges organized into groups, one of the group address ranges that includes the synchronize address range, wherein each of the group address ranges maps to a corresponding memory address range in a nonvolatile memory (NVM), and the identified group address range maps to a memory address range in the NVM that includes a first memory address that is identified for copy-on-write (COW) treatment;
transferring data corresponding to the group that includes the indentified group address range from the first node to a second node in an order that is determined based on the group table;
transmitting a marker from the first node to the second node after the transferring is completed;
waiting for the second node to acknowledge the marker before writing a copied address corresponding to the first memory address to the NVM; and
discarding the copied address in response to at least one of the transferring is not completed and the second node does not acknowledge the marker after a first threshold period.

13. The method of claim 12,
at the second node, discarding the transferred data corresponding to the group that includes the identified group address range in response to not receiving the marker within a second threshold period after receiving the transferred data.

14. A non-transitory computer-readable storage medium storing instructions that, if executed by a processor of a device, cause the processor to:
specify, in a group table at a first node, one or more groups that each include one or more group address ranges that are respectively mapped to memory address ranges of a nonvolatile memory (NVM);
copy, at the first node, a first memory address of the memory address range to a volatile memory, in response to a write operation for the first memory address; and
in response to a synchronize command that includes a synchronize address range:
identify a group that corresponds to the synchronize address range,
transfer address ranges associated with the identified group from the first node to the second node,
transmit a marker from the first node to the second node after the transfer is completed, and
if the transferred address ranges include the copied address:
discard the copied address at the first node if the second node does not acknowledge the marker within a first threshold period, and
write the copied address to the first memory address of the NVM if the second node acknowledges receipt of the marker.

15. The non-transitory computer-readable storage medium of claim 14, wherein the instructions further cause the processor to:
discard, at the second node, the transferred address ranges if the second node does not receive the marker within a second threshold period.

16. The non-transitory computer-readable storage medium of claim 14, wherein the instructions further cause the processor to:
associate each of the group address ranges with a ready flag,
set the ready flag of a given group address range if the given group address range is to be transferred to the second node, and
reset the ready flag of the given group address range after the given group address range is transferred to the second node.

17. The non-transitory computer-readable storage medium of claim 16, wherein the instructions further cause the processor to:
if the second node acknowledges receipt of the marker, reset the ready flag of the group address range that is transferred last after the copied address is written to the NVM.

18. The non-transitory computer-readable storage medium of claim 17, wherein the instructions further cause the processor to:
generate a log to record the group address ranges that have been transferred to the second node, wherein the log is to record the marker after the marker is transferred to the second node.

19. The non-transitory computer-readable storage medium of claim 18, wherein the instructions further cause the processor to:

stop and leave the transfer incomplete, if the copied address is lost before being transferred to the second node.

20. The non-transitory computer-readable storage medium of claim 19, wherein the instructions further cause the processor to:
if the transfer is interrupted by a power loss, if the marker is recorded in the log, and if the COW range is recorded before the marker in the log and the copied address is not written to the NVM, receive the copied address from the second node.

* * * * *